United States Patent [19]

Happak et al.

[11] 4,120,545
[45] Oct. 17, 1978

[54] HOUSING FOR AN ELECTRICAL OR ELECTRONIC APPARATUS

[75] Inventors: Heinz Happak; Alfred Wittmann, both of Munich, Germany

[73] Assignee: Siemens Aktiengesellschaft, Berlin & Munich, Germany

[21] Appl. No.: 800,896

[22] Filed: May 26, 1977

[30] Foreign Application Priority Data

May 28, 1976 [DE] Fed. Rep. of Germany ....... 2624148

[51] Int. Cl.² .................... A47B 81/06; H05K 5/00
[52] U.S. Cl. .................... 312/7 R; 174/50; 312/107; 312/320; 312/330 R; 312/349; 325/352; 361/380
[58] Field of Search .................. 312/257 R, 7 R, 107, 312/108, 111, 320, 349, 330, 257 A, 257 SK, 257 SM; 325/352, 353, 355; 361/380, 386; 174/50, 52 R

[56] References Cited

U.S. PATENT DOCUMENTS

| | | | |
|---|---|---|---|
| 3,012,835 | 12/1961 | Anderson et al. | 312/7 R |
| 3,177,404 | 4/1965 | Patmore | 174/52 R |
| 3,284,151 | 11/1966 | Morrison et al. | 312/244 |
| 3,338,647 | 8/1967 | Stewart | 312/204 |
| 3,348,148 | 10/1967 | Parsons et al. | 325/15 |
| 3,356,886 | 11/1967 | Tompkins | 312/244 |
| 3,377,115 | 4/1968 | Mansen et al. | 312/330 |
| 4,023,871 | 5/1977 | Dantzler | 312/108 |

FOREIGN PATENT DOCUMENTS

| | | | |
|---|---|---|---|
| 858,748 | 12/1940 | France | 312/257 R |
| 1,258,485 | 12/1971 | United Kingdom | 312/7 R |

Primary Examiner—Mervin Stein
Assistant Examiner—Alex Grosz
Attorney, Agent, or Firm—Hill, Gross, Simpson, Van Santen, Steadman, Chiara & Simpson

[57] ABSTRACT

A housing for a self-supporting interior structure of electrical or electronic apparatus has a front panel and a casing formed of two U-shaped casing members detachably connected with one another via side spacing members. The side spacing members are formed such that lateral depressions extend inwardly from the side spacing members and extend along the depth of the apparatus for accommodating guide elements such that the housing containing the apparatus will slide into a rack. Use of such depressions permits close vertical spacing of adjacent apparatus housings in a rack and also functions as a handle for transporting individual housings.

11 Claims, 6 Drawing Figures

HOUSING FOR AN ELECTRICAL OR ELECTRONIC APPARATUS

BACKGROUND OF THE INVENTION

1. Field of the Invention

The invention relates to a housing or cabinet for the self-supporting interior structure of an electrical or electronic apparatus provided with a front plate or panel and a casing formed of two U-shaped casing members which are detachably connected with one another via side spacing members.

2. Description of the Prior Art

A housing of this kind is known, for example, from U.S. Pat. No. 3,348,148. If several apparatus are combined one above the other in a rack, the housings of each apparatus are equipped for rack slide-in to their operating position by use of lower side edges or guide rails mounted thereon which are aligned with rails or shelf strips mounted on the rack. For the accommodation of the rack strips or rails, sufficient rack room is to be respectively provided between the rack slide-in members. Therefore, the room for the rack influences the total height of the rack, particularly with the use of telescopic rails.

SUMMARY OF THE INVENTION

It is an object of the invention to provide a housing or cabinet for facilitating an easy change-over of the apparatus from an individual or table-top apparatus to a rack slide-in requiring considerably less rack room including the required guide elements than conventional rack slide-ins. This is attained according to the invention by means of an arrangement and profiling of spacing members of the apparatus housing such that lateral depressions essentially extending over the apparatus depth are formed which accommodate the guide elements (guide angle, rack rail or such) for sliding-in of the housing into a rack.

The advantage obtainable with the invention consists particularly that the depressions of the profiled spacing members can space-savingly accommodate the guide elements of the apparatus and/or of the rack, and can also serve in the use of the apparatus in separate fashion such as table-top operation by serving either as a handle depression or for the accommodation of additional carrying handles.

In accordance with a preferred further development of the invention, the U-shaped casing members are dimensioned in such manner that they encircle the front panel at its edges and, if necessary, encircle edges of a front label plate. The housing accordingly has a greater stability and fastening means for the front label plate can be dispensed with. On the other hand, the enlargement of the exterior dimensions of the housing as a result of the mounting members is readily acceptable since free rack room is gained between the individual rack slide-ins by means of the displacement of the guide elements into the lateral depressions.

DESCRIPTION OF THE PREFERRED EMBODIMENTS

Figure 1:
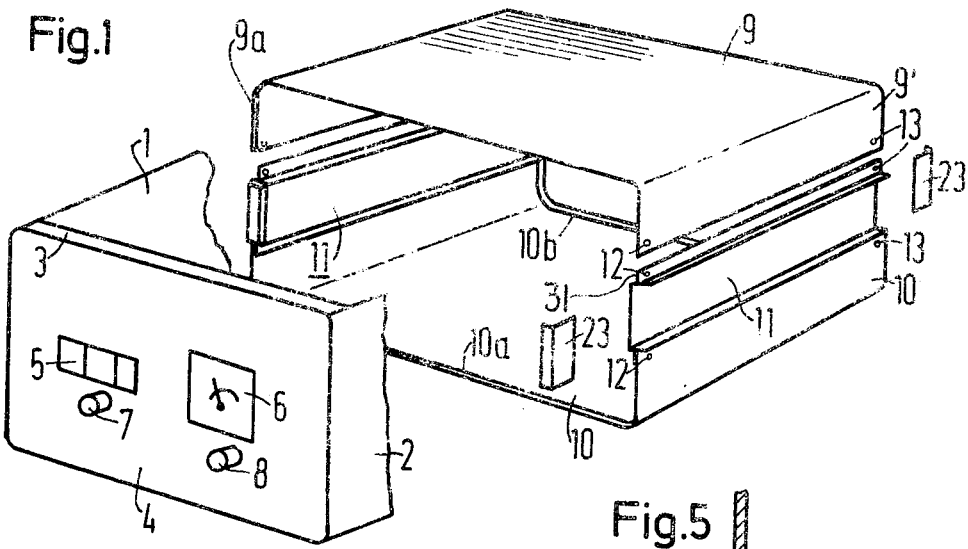
FIG. 1 illustrates an apparatus housing of this invention in dismantled condition.

FIG. 1 indicates the self-supporting interior structure of an electrical or electronic apparatus having two side plates 1, 2, and one of several profile rails 3 running parallel to one another and connecting the corners of the plates 1, 2 with one another. The structural components of this apparatus, not illustrated in detail, are arranged on carrier plates in a manner known per se, said carrier plates being held in guide rails which, for their part, are directly mounted between the portions 1 and 2 or 3, or between additional profile rails dividing the interior portions of the housing. The interior structure of the apparatus is closed at the front by a front plate or panel 4, on which, for example, a digital indicator device 5 and a meter 6 are mounted in the case of a receiver for electronic communication or for measuring technology. Operating parts 7, 8 may be provided for setting of characteristic values of the apparatus, for example the tuning frequency, the input resistance, the division factor of an input voltage divider, etc. A front label plate can additionally be put over the front panel carrying the necessary wording required for the operating processes.

Two U-shaped casing members 9, 10 whose bent side edges 9′, 10′ are detachably connected with one another via a strip-shaped spacing member 11 by means of side flanges 31 and screw connections or such in holes 12, 13 of the side cover of the interior structure. The casing members 9, 10 therein are preferably dimensioned such that they encircle the front panel 4 and project somewhat on all sides, vis-a-vis the interior structure at the edges of the front panel 4 by means of grooves 9a and 10a. The housing accordingly achieves greater stability in a simple manner. Furthermore, if one closes the interior structure by means of a back plate which can be held in a groove 10b of the casing member 10 and in a corresponding groove of the member 9, a housing of great stability which is closed on all sides results in the mounted condition of the casing members 9, 10.

Figures 2, 3:
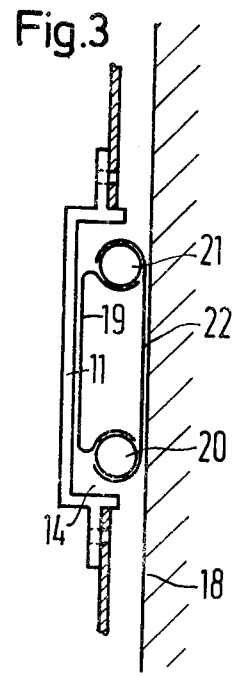
FIG. 2 illustrates a portion of the housing equipped for rack slide-in in accordance with FIG. 1.
FIG. 3 illustrates an alternate embodiment for the rack slide-in of FIG. 2.

The strip-shaped spacing members 11 are profiled in accordance with FIG. 2 such that a depression 14 is formed running parallel to the housing side edges vis-a-vis the edge walls 9′ and 10′ and which essentially extends over the total apparatus depth. It is preferable to structure the profile of the spacing portions 11 in detail in such a manner that slide areas 15 are formed with the aid of which the housing can be displaceably mounted onto shelf areas 16 of angle-shaped rails 17 which are rigidly mounted to a rack side wall 18. In this embodiment of the two spacing members 11 relating to one housing casing, a simple guide for rack slide-in results without the guide elements requiring a rack space between individual slide-in members arranged one upon the other.

Another embodiment of the guide elements for rack use of the apparatus is illustrated in FIG. 3. Here telescopic rails are used in which a first rail 19 is respectively mounted in a longitudinal direction in the base of the depression 14 of the spacing member 11, and a second rail 22, which is longitudinally displaceable vis-a- vis the first rail, is rigidly fastened to the rack side 18 and meshes with rail 19 via cylindrical guides 20, 21. Such a construction is preferably utilized for heavier rack slide-ins. In this case also, both spacing members 11 of a housing casing are similarly structured.

Figure 4:
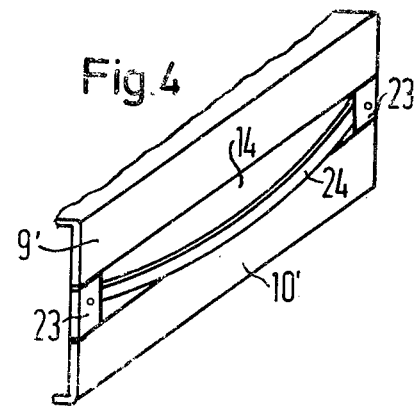
FIG. 4 illustrates a portion of the housing equipped for table-top operation and use.

The depressions 14 of the lateral spacing members 11 function either as handle depressions or for accommodating conventional band-shaped carrying handles 24 (FIG. 4) when the apparatus is used separately or for table-top operation.

In order to give the housing a pleasant appearance, inserts 23 (FIG. 1) are provided for closing off the depressions 14 at least at the end facing the front panel side. The inserts 23 respectively consist of an angle plate, the section of an angle-shaped extrusion profile, or a synthetic material member whose front edge side covers the depression 14 as viewed from the front panel 4, and whose outer face lies in line with the bent edge walls 9', 10' of the U-shaped casing members 9, 10 and neatly closes the casing surface in this area with respect to the exterior. However, when used for rack slide-in, only the insert 23 at the front panel can be utilized since the depressions 14 must remain open at their rear ends in order to accommodate the guide elements previously mentioned. The carrying handles 24, on the other hand, can be particularly advantageously mounted in the depressions 14 such that they are respectively held in the inserts closing the depressions.

Figure 5:
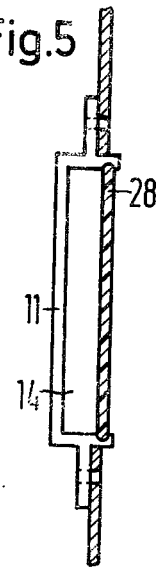
FIG. 5 shows an alternate embodiment for table-top operation.

FIG. 5 illustrates the depression 14 of each spacing portion 11 when completely covered by a shutter 28 in order to obtain a completely smooth surface of the respective housing side.

Figure 6:
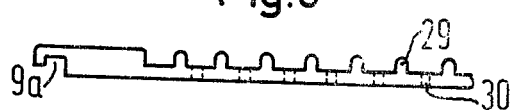
FIG. 6 illustrates a cross-section of a portion of the housing illustrated in FIG. 1.

In order to enlarge the surface area, and to thus obtain better heat radiation, the U-shaped casing portions are preferably provided with ribs 29 situated at the exterior, as can be recognized from the cross-section illustrated in FIG. 6 taken perpendicularly to the plane of the front panel. Perforations of the members 9 and 10 between the ribs as indicated at 30 further improves heat radiation.

The production of the U-shaped casing members 9, 10, and also of the spacing members is preferably performed by an extrusion method, whereby aluminum, for example, is utilized as the material for these members.

Although various minor modifications may be suggested by those versed in the art, it should be understood that we wish to embody within the scope of the patent warranted hereon, all such embodiments as reasonably and properly come within the scope of our contribution to the art.

We claim as our invention:

1. A housing for a self-supporting interior structure of electrical and electronic apparatus, comprising:
   upper and lower U-shaped casing members, each casing member having two edge walls, a front panel, and a side connecting and spacing member joining by the edge walls the upper and lower casing members on each of opposite sides of the cabinet; and
   each side connecting and spacing member comprising an integral extruded U-shaped channel forming a lateral depression extending inwardly of said casing member edge walls, said channel having flat upper and lower inwardly extending surfaces and a flat vertical wall inwardly of the edge walls extending between the upper and lower surfaces, flanges being provided extending above the upper surface and below the lower surface, said flanges attaching the spacing members to the edge walls, and said vertical wall and upper and lower surfaces of each U-shaped channel forming a guide rail.

2. A housing in accordance with claim 1, characterized in that the U-shaped casing members are dimensioned such that they encircle the front panel.

3. A housing in accordance with claim 2 in which the U-shaped casing members also encircle edges of a front label plate covering the front panel.

4. A housing in accordance with claim 1 in which said depression means formed in the members have gliding surfaces for being displaceably positioned on corresponding shelf surfaces mounted in the rack.

5. A housing in accordance with claim 1 characterized in that a first rail is respectively arranged in the depression means of the spacing members and a second rail is provided which is longitudinally displaceable vis-a-vis the first rail by use of a guide member and is respectively rigidly fastened to the rack.

6. A housing in accordance with claim 1 characterized in that the depression means of the side spacing members are covered by inserts at least at the ends facing the front panel.

7. A housing in accordance with claim 1 characterized in that the depression means of the side spacing members include carrying handles retained at ends of the depression means.

8. A housing in accordance with claim 1 characterized in that the depression means of the side spacing members are covered by shutters.

9. A housing in accordance with claim 1 characterized in that the U-shaped casing members are provided with cooling ribs and are perforated between said cooling ribs.

10. A system for supporting electrical and electronic apparatus in a rack, comprising:
    (a) a cabinet for electrical and electronic apparatus having upper and lower U-shaped casing members, each casing member having two edge walls, a front panel, and a side connecting and spacing member detachably joining by the edge walls the upper and lower casing members on each of opposite sides of the cabinet;
    (b) each side connecting and spacing member comprising an integral extruded U-shaped channel forming a lateral depression extending inwardly of said casing member edge walls, said channel having flat upper and lower surfaces and a flat vertical wall extending between the upper and lower surfaces, an integral flange being provided on each U-shaped channel upper and lower surface, said flanges attaching the spacing members to the edge walls; and
    (c) a rack having parallel vertical side walls and horizontal guide elements, said guide elements being receivable in each depression and slidably support said cabinet; whereby said inward depressions provide a grip for hand carrying of the cabinet permit simplified construction of the cabinet, and also allow close spacing of cabinets slidably received in the rack.

11. The system of claim 10 in which said inward depressions have a hand strap fastened therein such that when not in use the hand strap lies entirely within the depressions.

* * * * *